United States Patent [19]

Iwamoto

[11] Patent Number: 5,781,277
[45] Date of Patent: Jul. 14, 1998

[54] PROJECTION EXPOSURE APPARATUS AND EXPOSURE METHOD AND SEMICONDUCTOR DEVICE PRODUCTION METHOD THEREWITH

[75] Inventor: Kazunori Iwamoto, Utsunomiya, Japan

[73] Assignee: Canon Kabushiki Kaisha, Tokyo, Japan

[21] Appl. No.: 749,628

[22] Filed: Nov. 18, 1996

[30] Foreign Application Priority Data

Nov. 24, 1995 [JP] Japan ................... 7-329606

[51] Int. Cl.$^6$ ........................... G03D 27/42
[52] U.S. Cl. ........................... 355/53; 378/34
[58] Field of Search ............ 355/43–45; 102/20, 102/33; 378/34, 205, 209; 356/400, 401; 310/328

[56] References Cited

U.S. PATENT DOCUMENTS

| | | | |
|---|---|---|---|
| 4,803,712 | 2/1989 | Kembo et al. | 378/34 |
| 5,128,975 | 7/1992 | Iwamoto et al. | 378/34 |
| 5,172,160 | 12/1992 | Van Eijk et al. | 355/53 |
| 5,187,519 | 2/1993 | Takabayashi et al. | 355/53 |
| 5,204,712 | 4/1993 | Bouwer et al. | 355/53 |
| 5,446,519 | 8/1995 | Makinouchi | 355/53 |
| 5,467,720 | 11/1995 | Korenaga et al. | 108/20 |
| 5,544,213 | 8/1996 | Chiba et al. | 378/34 |
| 5,610,686 | 3/1997 | Osanai | 355/53 |

*Primary Examiner*—D. Rutledge
*Attorney, Agent, or Firm*—Fitzpatrick, Cella, Harper & Scinto

[57] ABSTRACT

A projection exposure apparatus includes a reticle stage for moving a reticle, a wafer stage for moving a wafer, a projection optical system for projecting a pattern formed on the reticle onto the wafer, a first supporting device for supporting at least one of the reticle stage and the wafer stage, a measurement device for measuring the position of at least one of the reticle and the wafer, a second supporting device for supporting the measurement device and a displacement/deformation absorber, through which the second supporting device is supported by the first supporting device, for absorbing displacement and deformation of the first supporting device. Also disclosed are exposure methods utilizing such a projection exposure apparatus.

8 Claims, 8 Drawing Sheets

PROJECTION EXPOSURE APPARATUS AND EXPOSURE METHOD AND SEMICONDUCTOR DEVICE PRODUCTION METHOD THEREWITH

BACKGROUND OF THE INVENTION

1. Field of the Invention

The present invention relates to a projection exposure apparatus for use in a photolithography process for producing a semiconductor device, a liquid crystal display device, or the like, and also to an exposure method and a semiconductor device production method using the projection exposure apparatus.

2. Description of the Related Art

Photolithography techniques are currently used in the production of a semiconductor device or a liquid crystal display device. The photolithography process includes an exposure process step for transferring a reticle pattern onto a wafer coated with a photosensitive material. The projection exposure apparatus of the type often called a step-and-repeat exposure apparatus is now widely used. In this step-and-repeat exposure apparatus, the surface of a wafer is divided into a plurality of exposure areas, and an exposure process is performed from one exposure area to another in a step-and-repeat fashion. In recent years, with the increase in the size of semiconductor devices, there is a need for a step-and-repeat projection exposure apparatus capable of exposing a greater area at one time. To achieve the above requirement, a scanning exposure type projection exposure apparatus has been developed. A rectangular band-shaped limited area of a reticle pattern is projected onto a wafer and both the reticle and the wafer are synchronously scanned so that the scanned area of the reticle pattern is transferred onto the wafer.

Figure 10:
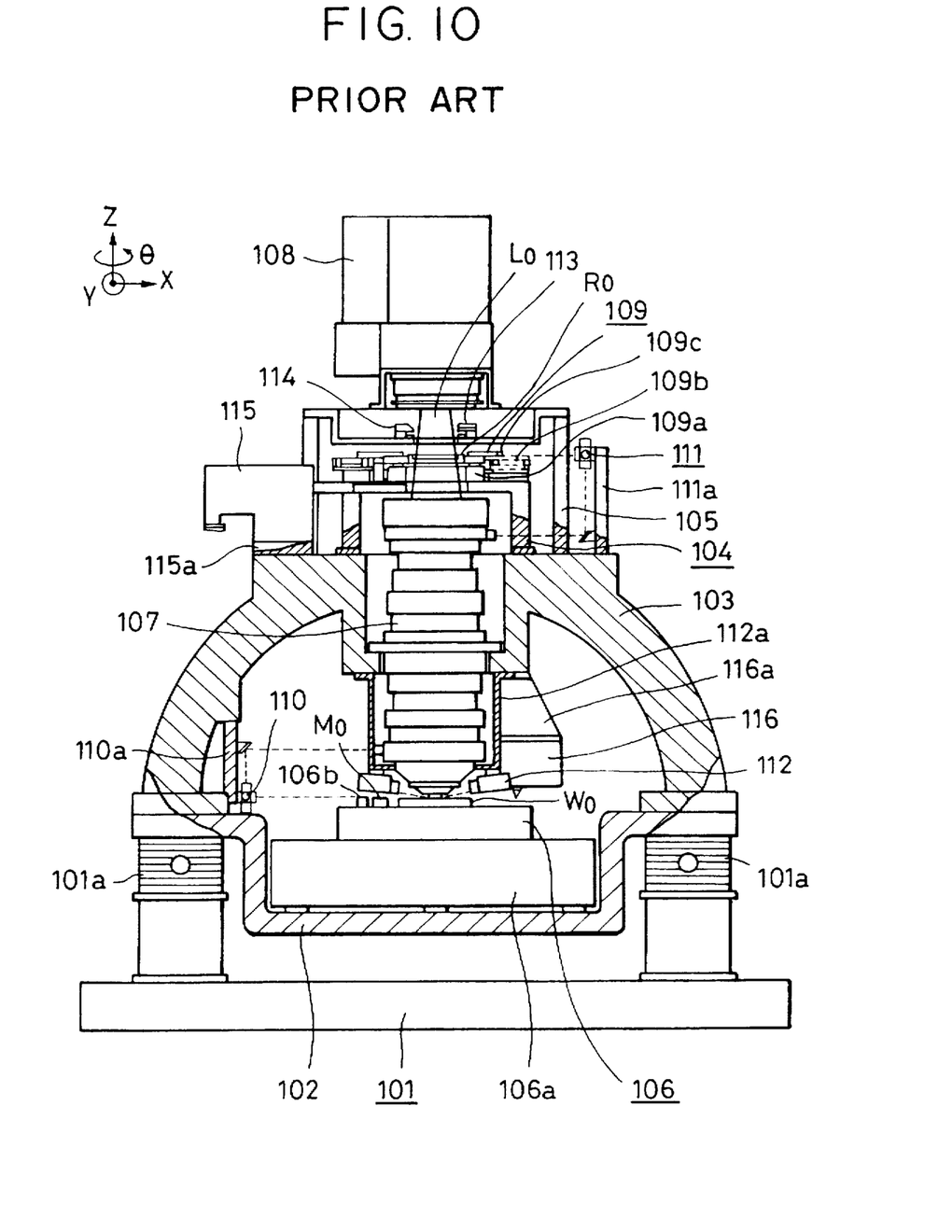
FIG. 10 is a front view, partially in cross section, illustrating a conventional projection exposure apparatus.

FIG. 10 illustrates a conventional projection exposure apparatus of such a scanning type. The apparatus includes: a supporting base 102 disposed on an apparatus pallet 101 via antivibration mounts 101a; a main frame 103 which is an integral part of the supporting base 102; and a reticle stage support 104 and a light source support 105 both disposed vertically on the main frame 103. A wafer stage 106 is disposed on the supporting base 102 via a wafer stage base plate 106a and also via a wafer scanning stage mechanism (not shown). The wafer stage 106 has a known 6-axis positioning mechanism. A projection optical system 107 is disposed on the main frame 103, in the center thereof. A light source 108 for emitting exposure light $L_0$ is disposed on the top of the light source support 105. On the reticle stage support 104, there is provided a reticle guide 109a which supports the bottom face of the reticle stage 109 in such a manner that the bottom face of the reticle stage 109 is not in direct contact with the reticle guide 109a. On the reticle stage support 104, there is also provided a reticle scanning stage mechanism 109b including a pair of linear motors disposed on either end of the reticle stage 109.

A reticle $R_0$ and a wafer $W_0$ are placed on the reticle stage 109 and the wafer stage 106, respectively. The reticle scanning stage mechanism 109b and the 6-axis positioning stage mechanism of the wafer stage 106 are synchronously driven in the Y-direction which is one of two axes perpendicular to the optical axis (Z-axis) associated with the exposure light $L_0$ thereby scanning the reticle $R_0$ and the wafer $W_0$ in the Y-direction. The exposure light $L_0$ has a rectangular section which is longer in the X-direction so that the rectangular area, longer in the X-direction, of the reticle pattern formed on the reticle $R_0$ is projected onto the wafer $W_0$. During the exposure process with the exposure light $L_0$, the reticle $R_0$ and the wafer $W_0$ are synchronously scanned in the Y-direction as described above thereby transferring the entire reticle pattern onto the wafer $W_0$. Before starting the scanning of the reticle $R_0$ and the wafer $W_0$, precise alignment (positioning) between the reticle $R_0$ and the wafer is performed so that the reticle pattern may be projected onto a correct exposure area of the wafer $W_0$.

If an alignment error occurs during the exposure process, that is, during the operation of scanning the reticle $R_0$ and the wafer $W_0$, a great transfer error can occur. To avoid the above problem, the positions of the wafer stage 106 and the reticle stage 109 are each measured repeatedly during the scanning operation and the alignment between the reticle $R_0$ and the wafer $W_0$ is corrected on the basis of the measurement result. The alignment correction will be described in further detail below.

The positions of the wafer stage 106 and the reticle stage 109 measured in the X-axis and Y-axis directions as well as the angle of rotation about the Z-axis (hereafter referred to as the position in the θ-direction) of the wafer stage 106 and the reticle stage 109 are determined by interferometers 110 and 111. In the measurement, the interferometers 110 and 111 detect the light reflected from L-shaped mirrors 106b and 109 disposed on the wafer stage 106 and the reticle stage 109, respectively, in an integral fashion, and determine the above positions on the basis of the detected interference patterns. These measured values are then evaluated, and if a positioning error in the X-axis direction is detected, the error is corrected by driving the X-axis driving mechanisms of the 6-axis positioning stage mechanism of the wafer stage 106. When a positioning error in the Y-axis direction is detected, the error is corrected by driving the Y-axis driving mechanism of the 6-axis positioning stage mechanism of the wafer stage 106 or by driving the reticle scanning stage mechanism 109b of the reticle stage 109. If a positioning error in the θ direction is detected, the θ direction driving part of the 6-axis positioning stage mechanism of the wafer stage 106 is driven or a relative difference in the driving amount between the pair of linear motors constituting the reticle scanning stage mechanism 109b is introduced thereby rotating the reticle stage 109 in the θ direction.

The reticle stage 109 is scanned under the guidance of the horizontal reference plane of the reticle guide 109a, and therefore, the positions in the Z-axis direction, in the ωX-direction (rotation about the X-axis), and in the ωY-direction (rotation about the Y-axis) are kept constant. The image plane on the wafer $W_0$ is measured with a wafer focus sensor 112 to determine the position of the wafer stage 106 in the Z-axis direction, in the ωX-direction, and in the ωY-direction. On the basis of the measurement result, the Z-axis driving mechanism, the ωX driving mechanism, and the ωY driving mechanism of the 6-axis positioning stage mechanism of the wafer stage 106 are driven so as to correct the positioning errors in the Z-, ωX-, and ωY-directions.

As described above, the alignment between the wafer $W_0$ and the reticle $R_0$ in the six directions is precisely controlled during the exposure process.

The alignment between the wafer stage 106 and the reticle stage 109 is performed using four microscopes 113–116 before starting an exposure process, as described below.

A first microscope 113 detects an alignment mark of the reticle $R_0$ placed on the reticle stage 109, and compares it with a reference mark on the reticle stage support 104. On the basis of the comparison result, the alignment between the reticle $R_0$ and the reticle stage 109 is adjusted. A second microscope 114 is of the type called a TTR (Through-The-Reticle) microscope and is used for alignment between the reticle $R_O$ and an alignment mark $M_O$ formed on the wafer stage 106, wherein the detection of the alignment mark is performed using exposure light $L_O$. A third microscope 115 is of the type called a TTL (Through-The-Lens) microscope via which an alignment mark on a scribe line of the wafer $W_O$ is compared with a reference mark provided in the microscope 115 thereby performing the alignment of the exposure area of the wafer $W_O$ at the exposure position just below the projection optical system 107, wherein the alignment mark on the scribe line is illuminated via the projection optical system 107 by an He—Ne laser beam to which the resist on the wafer is insensitive. A fourth microscope 116 is of the type called an off-axis microscope and is used to detect the position of the wafer $W_O$ relative to the wafer stage 106. In the detection, the wafer stage 106 is moved aside from the exposure position just below the projection optical system 107 and the alignment mark on the scribe line of the wafer $W_O$ is illuminated by white light. The alignment mark is then compared with a reference mark provided in the fourth microscope 116, thereby detecting the position of the wafer $W_O$ relative to the wafer stage 106.

The interferometers 110 and 111 for measuring the changes in the positions of the wafer stage 106 and the reticle stage 109 during the scanning operation, the sensor supports 110a–112a supporting the wafer focus sensor 112, and the microscope supports 115a and 116a supporting the third and fourth microscopes 115 and 116 are disposed in the vertical position on or suspended from the main frame 103 together with the reticle stage support 104 and the light source support 105. The first and second microscopes 113 and 114 are supported together with the light source 108 by the light source support 105.

In the conventional technique, as described above, the supporting base 102 supporting the wafer stage 106 thereon and the reticle stage support 104 supporting the reticle stage 109 thereon are connected to the main frame 103 in an integral fashion, and furthermore, the projection optical system 107, and the supports 110a–112a for supporting the interferometers 110, 111 and the wafer focus sensor 112 are all connected to the main frame 103 in an integral fashion. Therefore, if deformation or vibration occurs in the main frame 103 due to a reaction against the force of driving the 6-axis positioning stage mechanism for scanning the wafer stage 106 or against the force of driving the reticle scanning stage mechanism 109c for scanning the reticle stage 109, or due to an unbalanced load which can occur when the wafer stage 106 or the reticle stage 109 moves, then the deformation or the vibration propagates to the interferometers 110 and 111 and the wafer focus sensor 112 or other parts. The above propagation of the deformation or the vibration results in degradation in the reliability of the operation of the above-described parts, and thus results in a great transfer error.

One known technique to solve the above problems is to increase the rigidity of the main frame so as to reduce the vibration and the deformation due to the unbalanced load or the force of driving the 6-axis positioning stage mechanism of the wafer stage or the force of driving the reticle scanning stage mechanism. Another technique is to provide a correction table for correcting the deformation of the main frame. However, these techniques have the problem of an increase in the size and weight of the main frame. Another problem is that the structure becomes complicated.

SUMMARY OF THE INVENTION

It is a general object of the present invention to solve the above problems. More specifically, it is an object of the present invention to provide a projection exposure apparatus having no problems associated with degradation in reliability of the operation of the measurement system for controlling the alignment between a wafer and a reticle due to a reaction against the force of driving the wafer stage or the reticle stage or due to an unbalanced load which occurs when the stage moves. It is another object of the present invention to provide an exposure method and also a method of producing a semiconductor device using such a projection exposure apparatus.

According to an aspect of the present invention, there is provided a projection exposure apparatus including: a reticle stage for moving a reticle; a wafer stage for moving a wafer; a projection optical system disposed between the wafer stage and the reticle stage; first supporting means for supporting at least one of the reticle stage and the wafer stage; measurement means for measuring the position and the rotation of at least one of the reticle and the wafer; second supporting means for supporting said measurement means; and displacement/deformation absorbing means, through which said second supporting means is supported by said first supporting means, for absorbing displacement and deformation of the first supporting means.

The displacement/deformation absorbing means preferably includes at least three sliding members elastically connected to one of the first and second supporting means, wherein the above-described at least three sliding members support spherical members which are integral parts of the other one of the first and second supporting means, the spherical members being supported such that the spherical members may freely roll. Each of said sliding members preferably includes static-pressure bearing means which creates a non-contact space between the first and second supporting means.

The displacement/deformation absorbing means may include at least three cylindrical hinges, either end of each of the three cylindrical hinges being integrally connected to one of the first and second supporting means.

The displacement/deformation absorbing means may be a kinematic mount which connects the first and second supporting means via three spherical members formed as integral parts of one of the first and second supporting means, the spherical members being fitted into a conical recess, a V-shaped groove, and a loose fitting recess, respectively, which are all formed on the other one of the first and second supporting means.

In the present invention, the first supporting means for supporting the wafer stage and the reticle stage is separate from the second supporting means for supporting the measurement means, and the first and second supporting means are connected to each other via the displacement/deformation absorbing means. In this arrangement, even if displacement or deformation occurs in the first supporting means due to a reaction against the force of driving the wafer stage or the reticle stage or due to an unbalanced load which can occur when the stage moves, the displacement or the deformation is absorbed by the displacement/deformation absorbing means. As a result, no degradation occurs in the reliability of the operation of the measurement means supported by the second supporting means. This ensures that the alignment between the wafer and the reticle can be controlled precisely, and thus, it is possible to achieve very high accuracy in a pattern transferring or printing operation.

In particular, in a scanning type projection exposure apparatus in which both a wafer and a reticle are scanned in a synchronous manner, both the reticle stage and the wafer stage are continuously driven during an exposure process, and thus, deformation and displacement occur periodically in the first supporting means due to the force of driving the reticle stage or the wafer stage and due to the unbalanced load which occurs when the stages move. Therefore, in a projection exposure apparatus of this type, the displacement/deformation absorbing means is particularly useful in preventing deformation and displacement of the first supporting means from propagating to the second supporting means. Thus, the displacement/deformation absorbing means of the present invention significantly contributes to the improvement in the transfer or printing accuracy.

In another aspect, the present invention relates to exposure methods that include steps of providing a projection exposure apparatus of the type dicussed above and either exposing the wafer, using the projection optical system, to transfer a pattern formed on the reticle onto the wafer or transferring, through the projection optical system, a pattern formed on the reticle onto the wafer.

DESCRIPTION OF THE PREFERRED EMBODIMENTS

Figure 1:
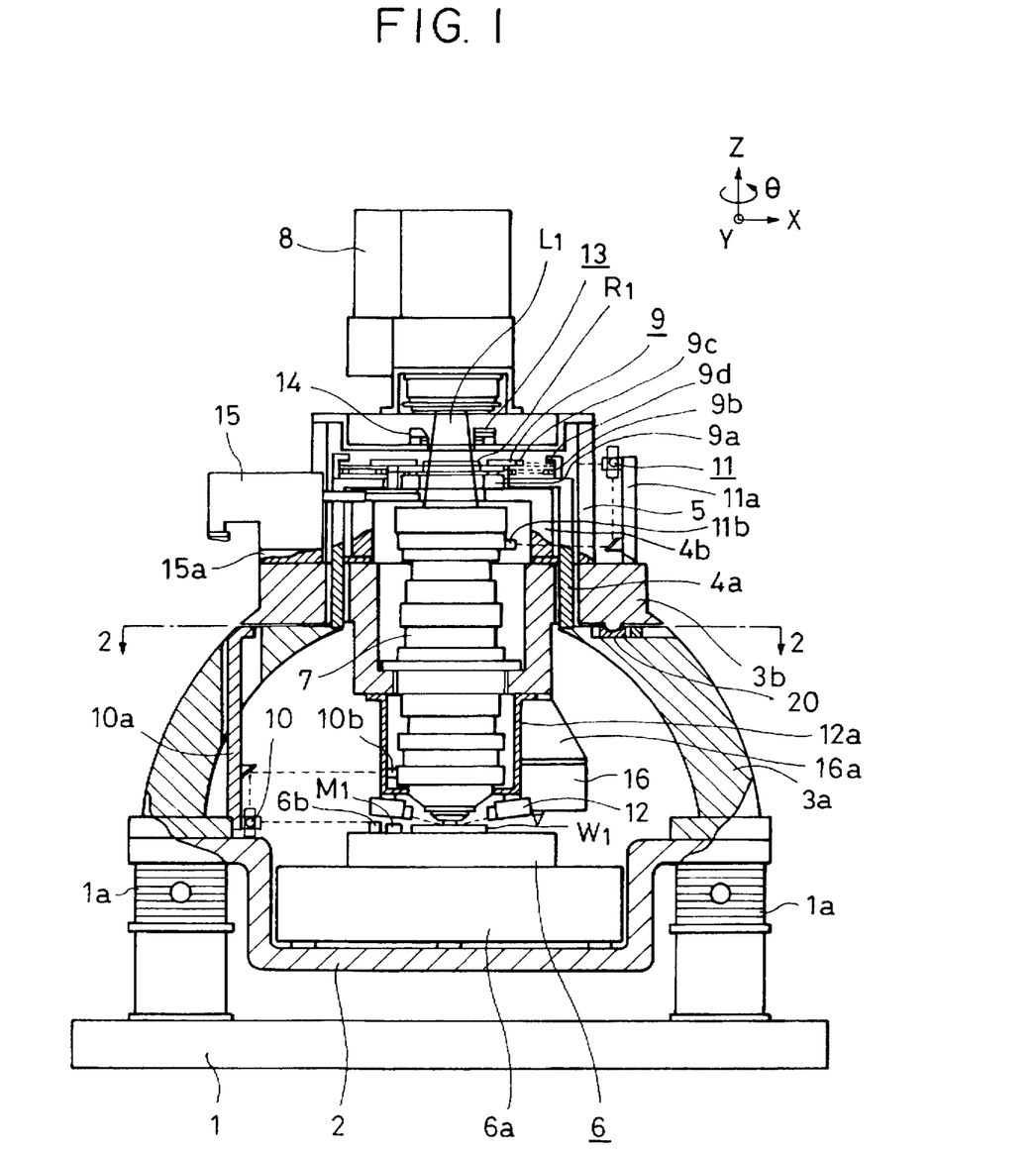
FIG. 1 is a front view, partially in cross section, illustrating a projection exposure apparatus according to a first embodiment of the invention.

FIG. 1 is a front view, partially in cross section, illustrating a projection exposure apparatus according to a first embodiment of the invention. As shown in FIG. 1, the apparatus includes: a supporting base 2 supported on an apparatus pallet 1 via antivibration mounts 1a; a main frame 3a serving as a first support means which is an integral part of the supporting base 2; a reticle stage support 4a disposed vertically on the main frame 3a; a top frame 3b serving as a second support means disposed on the main frame 3a via a displacement absorbing mechanism 20 serving as a displacement/deformation absorber means; a light source support 5 supported on the top frame 3b, wherein the wafer stage 6 is supported on the supporting base 2 via a wafer stage base plate 6a and a wafer scan stage mechanism (not shown), and the wafer stage 6 has a known 6-axis positioning mechanism. A projection optical system 7 is supported on the top frame 3b, in the center thereof. A light source 8 for emitting exposure light $L_1$ is disposed on the top of the light source support 5. Furthermore, a reticle guide 9a supports the bottom face of a reticle stage 9 in such a manner that the bottom face of the reticle stage 9 is not in direct contact with the reticle guide 9a. Also, a reticle scanning stage mechanism 9b, including a pair of linear motors, is disposed on either end of the reticle stage 9.

A reticle $R_1$ and a wafer $W_1$ are placed on the reticle stage 9 and the wafer stage 6, respectively. The reticle scanning stage mechanism 9b and the 6-axis positioning stage mechanism of the wafer stage 6 are synchronously driven in the Y-direction which is one of two axes perpendicular to the optical axis (Z-axis) associated with the exposure light $L_1$, thereby scanning the reticle $R_1$ and the wafer $W_1$ in the Y-direction. The exposure light $L_1$ has a rectangular section which is longer in the X-direction so that the rectangular area, longer in the X-direction, of the reticle pattern formed on the reticle $R_1$ is projected onto the wafer $W_1$. During the exposure process with the exposure light $L_1$, the reticle $R_1$ and the wafer $W_1$ are synchronously scanned in the Y-direction as described above thereby transferring the entire reticle pattern onto the wafer $W_1$. Before starting the scanning of the reticle $R_1$ and the wafer $W_1$, precise alignment (positioning) between the reticle $R_1$ and the wafer $W_1$ is performed so that the reticle pattern may be projected onto a correct exposure area of the wafer $W_1$.

If an alignment error occurs during the exposure process, that is, during the operation of scanning the reticle $R_1$ and the wafer $W_1$, a significant transfer error can occur. To avoid the above problem, the positions of the wafer stage 6 and the reticle stage 9 are each measured repeatedly during the scanning operation and the alignment between the reticle $R_1$ and the wafer $W_1$ is corrected on the basis of the measurement result. This correction process is performed as described below.

The positions of the wafer stage 6 and the reticle stage 9 measured in the X-axis and Y-axis directions as well as the angle of rotation about the Z-axis (the position in the θ-direction) of the wafer stage 6 and the reticle stage 9 are determined by interferometers 10 and 11 serving as interference pattern detectors. In the measurement, the interferometers 10 and 11 detect the light reflected from L-shaped mirrors 6b and 9c disposed on the wafer stage 6 and the reticle stage 9, respectively, in an integral fashion, and determine the above positions on the basis of the detected interference patterns. These measured values are then evaluated, and if a positioning error in the X-axis direction is detected, the error is corrected by driving the X-axis driving mechanism of the 6-axis positioning stage mechanism of the wafer stage 6. When a positioning error in the Y-axis direction is detected, the error is corrected by driving the Y-axis driving mechanism of the 6-axis positioning stage mechanism of the wafer stage 6 or by driving the reticle scanning stage mechanism 9b of the reticle stage 9. If a positioning error in the θ direction is detected, the θ-direction driving part of the 6-axis positioning stage mechanism of the wafer stage 6 is driven or a relative difference in the driving amount between the pair of linear motors constituting the reticle scanning stage mechanism 9b is introduced thereby rotating the reticle stage 9 in the θ direction.

The reticle stage 9 is scanned under the guidance of the horizontal reference plane of the reticle guide 9a. Therefore, the positions in the Z-axis direction, in the ωX-direction (rotation about the X-axis), and in the ωY-direction (rotation about the Y-axis) are kept constant. The image plane on the wafer $W_1$ is measured with a wafer focus sensor 12 to determine the position of the wafer stage 6 in the Z-axis direction, in the ωX-direction, and in the ωY-direction. On the basis of the measurement result, the Z-axis driving mechanism, the ωX driving mechanism, and the ωY driving mechanism of the 6-axis positioning stage mechanism of the wafer stage 6 are driven so as to correct the positioning errors in the Z-, ωX-, and ωY-directions.

As described above, the alignment between the wafer $W_1$ and the reticle $R_1$ in the six directions is precisely controlled during the exposure process. The weight of the reticle stage 9 is canceled by the attracting force of a magnet 9d. A reticle guide support 4b for supporting the reticle guide 9a is disposed vertically on top frame 3b.

The alignment between the wafer stage 6 and the reticle stage 9 is performed using four microscopes 13–16 before starting an exposure process, as described below.

A first microscope 13 detects an alignment mark of the reticle $R_1$ placed on the reticle stage 9, and compares it with a reference mark on the reticle stage support 4. On the basis of the comparison result, the alignment between the reticle $R_1$ and the reticle stage 9 is adjusted. A second microscope 14 is of the type called a TTR microscope and is used for alignment between the reticle $R_1$ and an alignment mark $M_1$ formed on the wafer stage 6, wherein the detection of the alignment mark is performed using exposure light $L_1$. A third microscope 15 is of the type called a TTL (Through-The-Lens) microscope and is used to perform the alignment of the exposure area of the wafer $W_1$ at the exposure location. In the alignment process through the third microscope 15, an alignment mark formed on a scribe line of the wafer $W_1$ is illuminated by a non-exposing He—Ne laser beam through the projection optical system 7, and the position of the wafer $W_1$ is adjusted so that the above alignment mark comes to a correct position with respect to the reference mark provided in the microscope 15, thereby positioning the exposure area of the wafer $W_1$ at a correct exposure location directly below the projection optical system 7. A fourth microscope 16 is of the type called an off-axis microscope and is used to detect the position of the wafer $W_1$ relative to the wafer stage 6. In this detection process through the fourth microscope 16, the wafer stage 6 is moved aside from the exposure position which is just below the projection optical system 7, and the alignment mark on the scribe line of the wafer $W_1$ is illuminated by white light. Then, the position of the wafer $W_1$ relative to the wafer stage 6 is detected by detecting the position of the above alignment mark with respect to the reference mark provided in the fourth microscope 16.

As described above, the reticle stage support 4a, which supports the reticle scanning stage mechanism 9b, is disposed vertically on the main frame 3a. The reticle guide support 4b, which supports the reticle guide 9a, is disposed vertically on the top frame 3b. The interferometers 10 and 11, the sensor supports 10a–12a supporting the wafer focus sensor 12, and the microscope supports 15a and 16a supporting the third and fourth microscopes are disposed in a vertical position on or suspended from the main frame 3b together with the reticle stage support 4b and the light source support 5. The first and second microscopes 13 and 14 are supported together with the light source 8 by the light source support 5. As described above, the main frame 3a supports the top frame 3b via the displacement absorbing mechanism 20.

Figure 2:
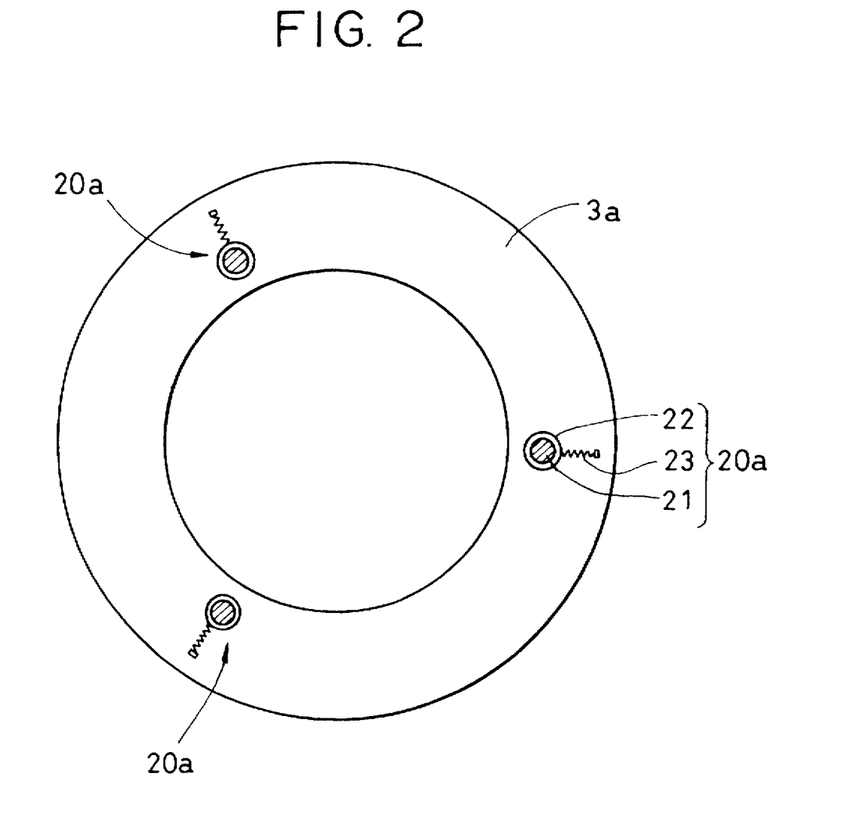
FIG. 2 is a cross-sectional view taken along line 2—2 of FIG. 1.

As shown in FIG. 2, the displacement absorbing mechanism 20 includes three restriction units 20a disposed at equal intervals in the circumferential direction on the upper end of the main frame 3a. Each restriction unit 20a includes a spherical member 21 projecting downward from the bottom face of the top frame 3b; a sliding member 22 including a static-pressure spherical-seated bearing 22a (shown in FIG. 3) supporting the spherical member 21 without direct contact therewith such that the spherical member 21 can freely roll; and a spring 23 for elastically connecting the sliding member 22 to the main frame 3a.

Figure 3:
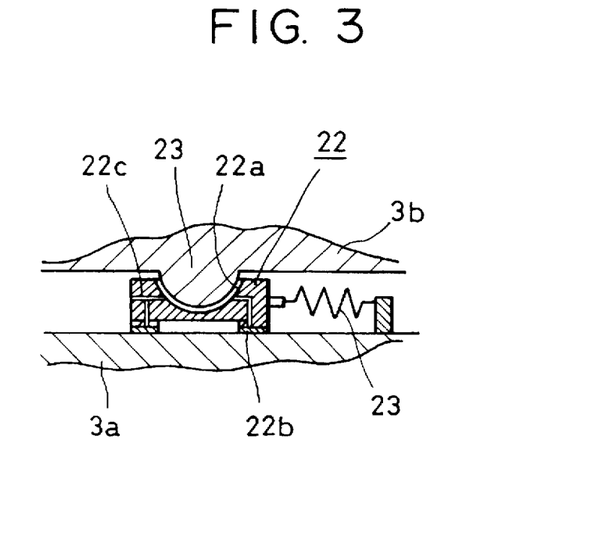
FIG. 3 is a schematic diagram illustrating a displacement absorbing mechanism used in the apparatus shown in FIG. 1.

On the bottom face of each sliding member 22 is provided a static-pressure flat seat bearing 22b, which is adapted to freely slide in a non-contact fashion in an arbitrary direction on the reference plane (XY plane) on the main frame 3a. Thus, the sliding member 22 is free in elastic displacement on the main frame 3a in the X-axis direction, in the Y-axis direction, and in the θ-direction within the range limited by the spring 23.

The static-pressure spherical-seated bearing 22a and the static-pressure flat seat bearing 22b of the sliding member 22 are made of a porous pad with a spherical shape serving as a static-pressure bearing and a porous pad with a flat shape serving as a static-pressure bearing, respectively. Through pipe 22c provided inside the sliding member 22, pressurized air is supplied into the space between the spherical member 21 of the top frame 3b and the static-pressure spherical-seated bearing 22a and also into the space between the above-described reference plane of the main frame 3a and the static-pressure flat seat bearing 22b so as to form an air film in the above spaces thereby achieving non-contact bearings.

The spring 23 urges the sliding member 22 inward along a radial direction toward a predetermined location of the main frame 3a. If the sliding member 22 moves together with the top frame 3b on the main frame 3a in the X-axis direction, in the Y-axis direction, or in the θ-direction, the urging force of the spring 23 causes the sliding member 22 to quickly return to the original position.

As described above, the sliding member 22 of each restriction unit 20a is free in elastic displacement with respect to the main frame 3a in the X-axis direction, in the Y-axis direction, and in the θ-direction, and furthermore, the sliding member 22 supports the lower surface of the spherical member 21, which is an integral part of the top frame 3b in such a manner that the spherical member 21 can freely roll in an arbitrary direction. Therefore, the sliding member 22 can freely move relative to the top frame 3b in the ωX-direction, ωY-direction, and θ-direction. Thus, the sliding member 22 connects the top frame 3b with the main frame 3a in such a manner that the top frame 3b and the main frame 3a can elastically move relative to each other freely in an arbitrary direction.

Since the displacement absorbing mechanism 20 is constituted by such restriction units 20a, when deformation or vibration occurs in the main frame 3a supporting the wafer stage 6 and the reticle stage 9 due to the reaction force against the force of driving and scanning the wafer stage 6 and the reticle stage 9 or due to an unbalanced load arising in the motion of the stage, the displacement or the deformation of the main frame 3a is absorbed by the restriction units 20a. This ensures high reliability in the operation of the interferometers 10 and 11, which control the alignment of the wafer stage 6 and the reticle stage 9, and also ensures high reliability in the operation of the wafer focus sensor 12 regardless of the above deformation or the displacement of the main frame 3b.

As in the interferometers 10 and 11, the alignment system including the optical system 7, the light source 8, and the four microscopes 13–16 are also supported by the top frame 3b. Therefore, high reliability is achieved in the operation of the microscopes 13–16 and in the optical characteristics of the projection optical system 7 without influence of the force driving the wafer stage 6 and the reticle stage 9 during the alignment process and any unbalanced load arising from the motion of the stages.

Disturbances such as ambient atmosphere fluctuations can cause an error in the measurement with the laser beam using the interferometers 10 and 11. The above error is corrected on the basis of the information obtained by illuminating reference mirrors 10b and 11b on the lens barrel of the projection optical system by a reference beam. Each antivibration mount 1a supporting the supporting base 2 includes a voice coil motor which cuts off external vibrations propagating via the floor and the apparatus pallet 1 thereby preventing the vibrations from being transmitted to the wafer stage 6 or the reticle stage 9. Furthermore, the voice coil motors quickly dampen vibrations which occur in the main frame 3a due to the reaction against the force of driving the wafer stage 6 and the reticle stage 9.

Furthermore, in the present embodiment as described earlier, the reticle stage 9 is supported by means of the magnetic force of the magnet 9d so as to cancel the weight of the reticle stage. As a result, the greater part of the weight of the reticle stage 9 and the reticle scanning stage mechanism 9b is supported by the reticle stage support 4a and thus, these weights have no influence on the top frame 3b. That is, these weights do not cause either deformation or vibration in the top frame 3b.

As can be seen from the above description, the arrangement of the invention removes all disturbances which can result in degradation in the optical characteristics of the projection optical system 7 or in the reliability of operation of the sensors, such as the interferometers 10, 11 or the alignment microscopes, thereby achieving a significant improvement in the transferring and printing accuracy of the projection exposure apparatus.

Figure 4:
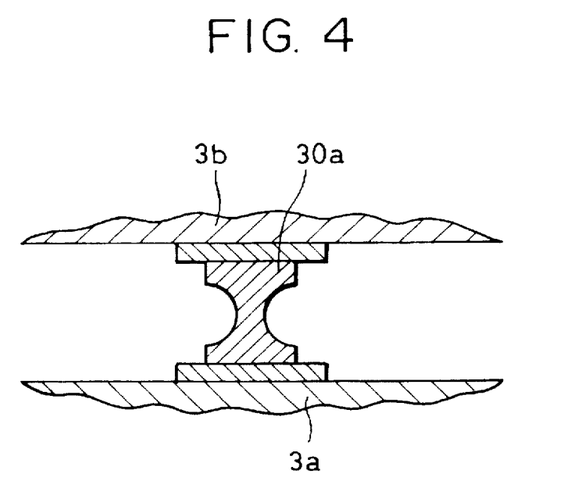
FIG. 4 is a schematic diagram illustrating a variation to the apparatus shown in FIG. 1.

In the embodiment described above, although the restriction units 20a are employed to form the displacement absorbing mechanism 20, cylindrical hinges 30a having a structure such as that shown in FIG. 4 may also be employed. In these cylindrical hinges 30a, the central portion of each cylindrical structure has a smaller diameter than the end portions so that both ends may elastically move relative to each other freely in the X-axis direction, Y-axis direction, θ-direction, ωX-direction, and ωZ-direction. The ends of each of the cylindrical hinges 30a are connected in an integral fashion with the top frame 3b and the main frame 3a, respectively.

Figure 5:
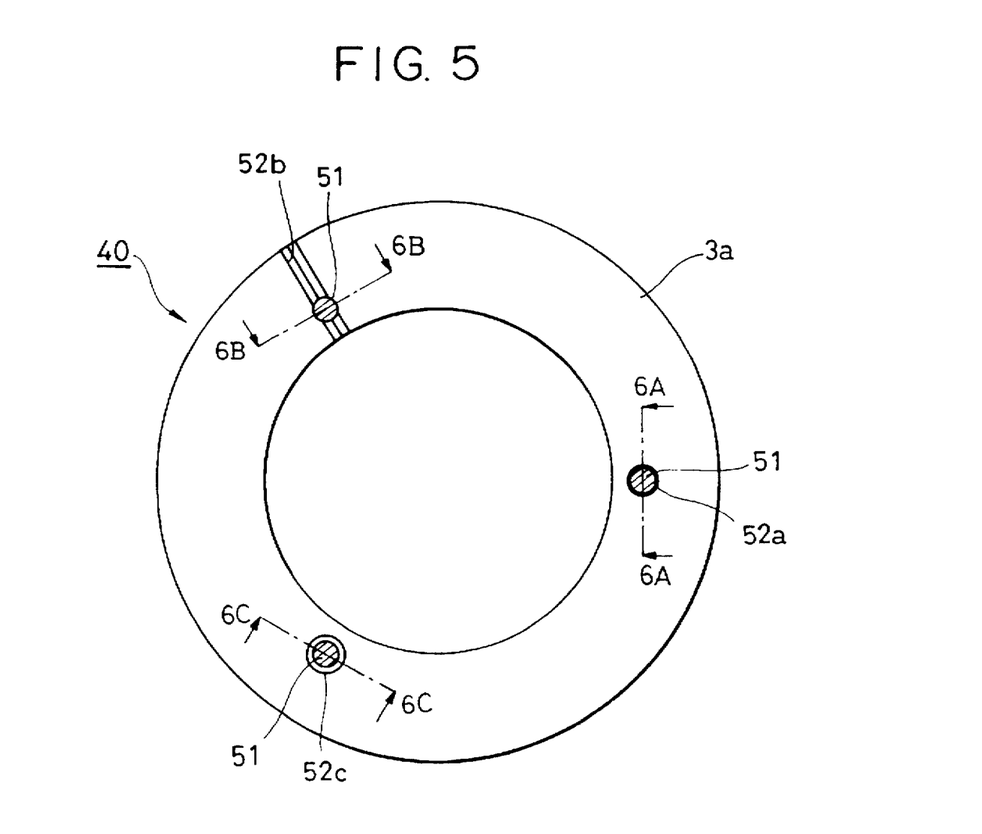
FIG. 5 is a schematic diagram illustrating another variation to the apparatus shown in FIG. 1.
Figure 6A:
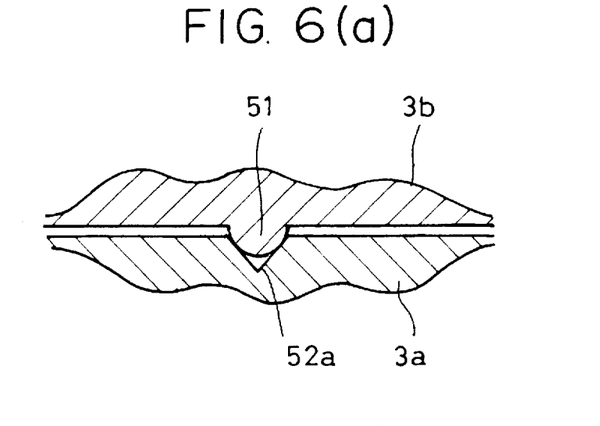
FIGS. 6(a) through 6(c) are partial cross-sectional views illustrating three major parts of the apparatus shown in FIG. 5, taken along lines 6A—6A, 6B—6B, and 6C—6C, respectively.
Figure 6B:
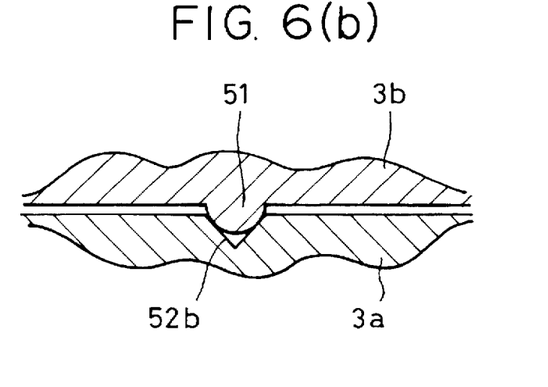
Figure 6C:
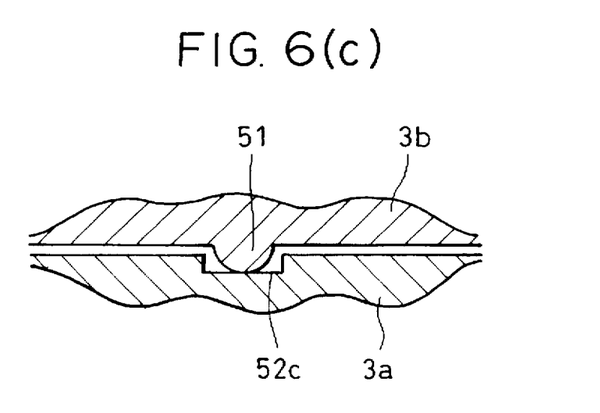

The displacement absorbing mechanism 20 may be replaced by a kinematic mount 40 shown in FIG. 5. The kinematic mount 40 includes three spherical members 51 disposed at equal intervals in the circumferential direction on the bottom face of the top frame 3b, wherein the spherical members 51, as shown in FIGS. 6(a) through 6(c), are fitted into a conical recess 52a, a V-shaped groove 52b extending in a radial direction, and a loose fitting recess with a flat and large bottom face, respectively, formed on the upper face of the main frame 3a. The top frame 3b is restricted in motion in the X-axis direction and also in the Y-axis direction by and only by the spherical member 51 fitted into the conical recess 52a formed on the main frame 3a. Thus, the displacement or deformation of the main frame 3a relative to the top frame 3b is absorbed by the displacement in the ωY direction and in the θ direction of the spherical member 51 fitted in the conical recess 52a and by the displacement in the ωZ direction, in the ωX direction, and in the θ direction of the V-shaped groove 52b, and furthermore by the displacement in an arbitrary direction of the spherical member 51 fitted into the loose fitting recess 52c.

Figure 7:
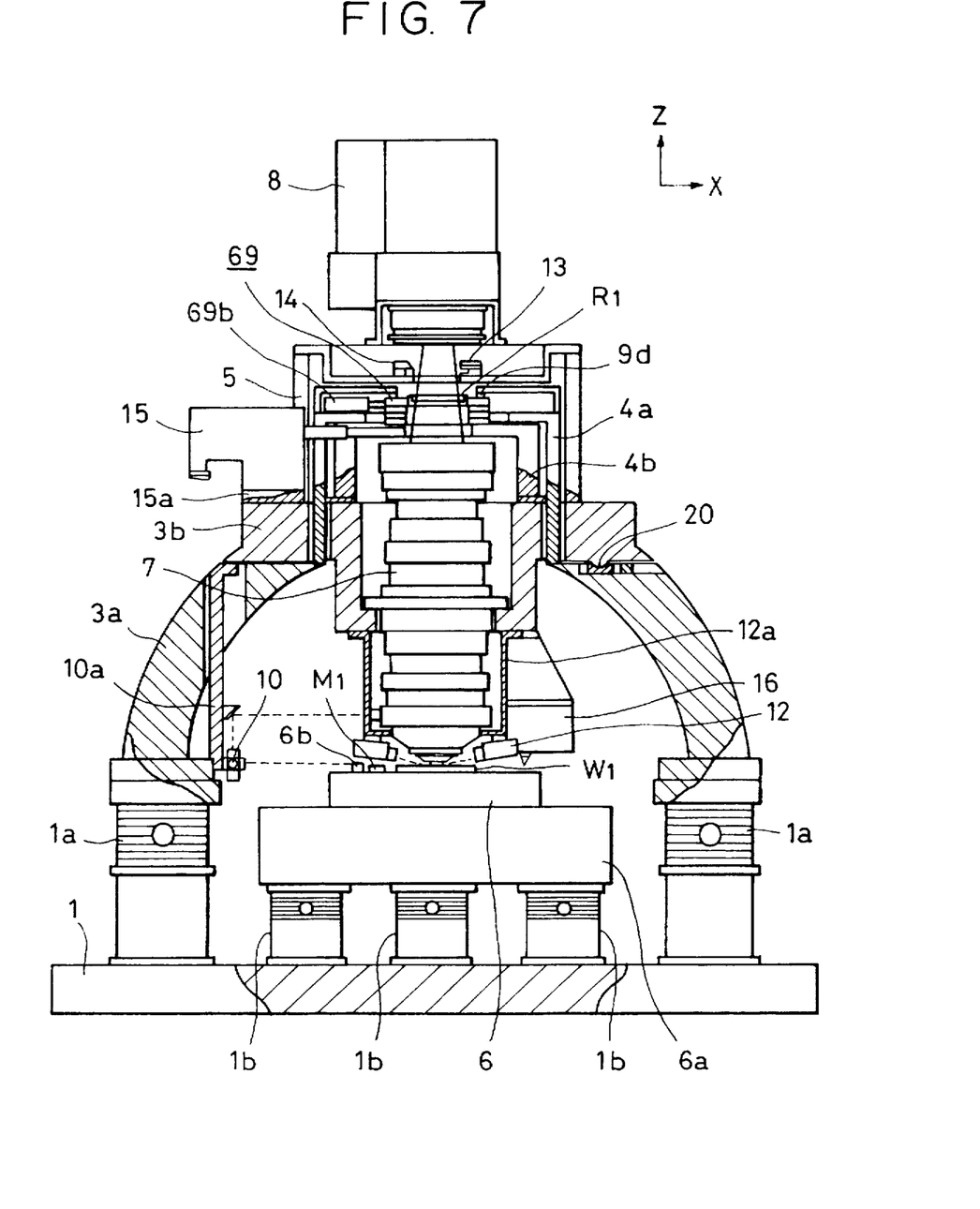
FIG. 7 is a front view, partially in cross section, illustrating a projection exposure apparatus according to a second embodiment of the invention.

FIG. 7 illustrates a second embodiment of a projection exposure apparatus according to the present invention. This second embodiment has a similar structure to that of the first embodiment except that the reticle scanning stage mechanism 9b of the first embodiment is replaced by a reticle stage driving mechanism 69b of the type widely used for driving the reticle stage 69 in the X-axis direction, in the Y-axis direction, and in the θ direction and except that the second embodiment has no interferometer for measuring the position of the reticle stage. Therefore, the parts except the reticle stage 69 and the reticle stage driving mechanism 69b are denoted by the same reference numerals as those used in the first embodiment and they are not described here in further detail. In this second embodiment, the wafer stage 6 is supported via the wafer stage base plate 6a by the antivibration mount 1b on the apparatus pallet 1 and thus, the wafer stage is independent of the main frame 3a.

In this step-and-repeat projection exposure apparatus of the common type, the top frame 3b supporting the microscopes 13–16 and the projection optical system 7 of the alignment system is connected via a displacement absorbing mechanism 20 or a kinematic mount with the main frame 3a supporting the wafer stage 6 and the reticle stage 69 thereby preventing the influence of the force of driving the wafer stage 6 or the reticle stage 69 on the interferometer 10, the microscopes 13–16 in the alignment system, and the projection optical system 7 and thus preventing the degradation in the alignment accuracy and the degradation in the optical characteristics of the projection optical system 7. Thus, the apparatus of the second embodiment can provide high transfer and printing accuracy. In this second embodiment, the wafer stage base plate 6a is supported directly by the apparatus pallet 1 via the antivibration mount.

Figure 8:
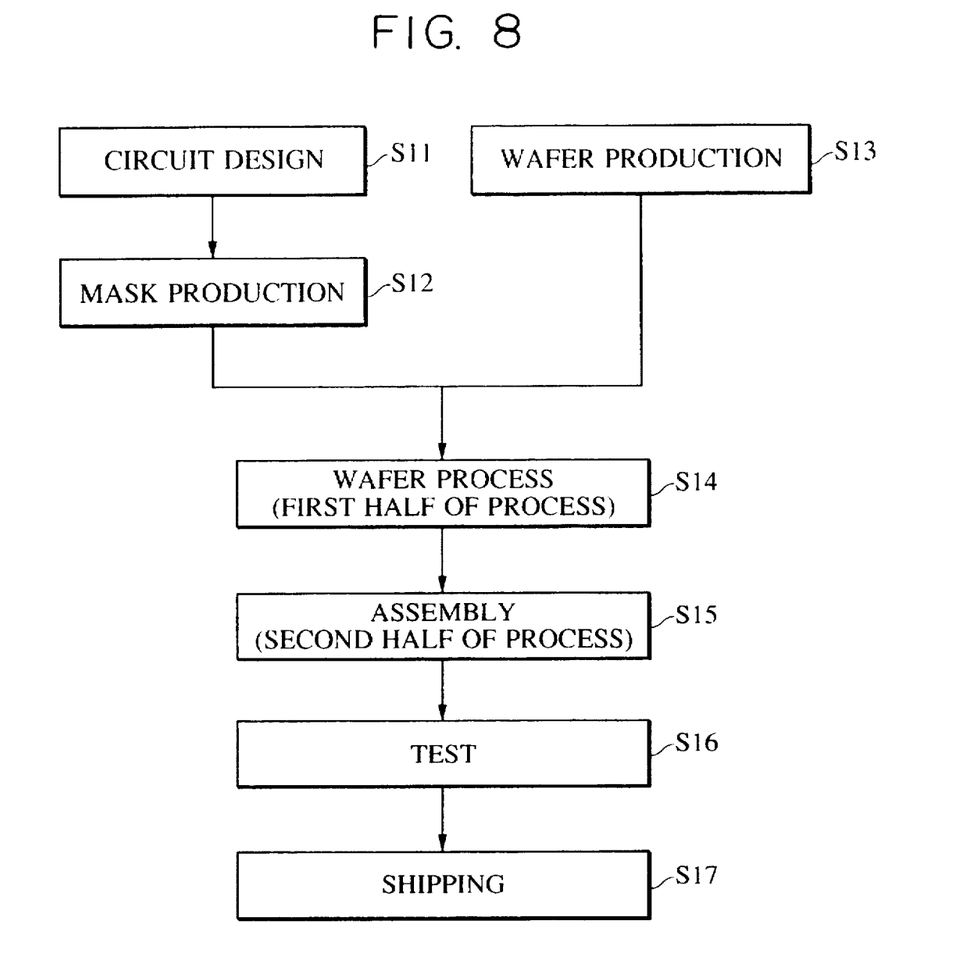
FIG. 8 is a flowchart illustrating production processes of a semiconductor device.

Now, an example of a method of producing a semiconductor device using the projection exposure apparatus according to the present invention will be discribed. FIG. 8 is a flowchart illustrating the processing steps of producing a micro device (a semiconductor chip such as an IC, an LSI liquid crystal panel, a CCD, a thin-film magnetic head, or a micro machine, for example). In step 11 (circuit design), a semiconductor device circuit is designed. In step 12 (mask production), masks having circuit patterns corresponding to the circuit designed in step 11 are produced. In step 13 (wafer production), a wafer is produced using a semiconductor material such as silicon. In step 14 (wafer process or often called a first half process), an actual circuit is formed on the wafer by means of a lithography technique using the masks and the wafer produced in the previous steps. In step 15 (assembly or often called a second half process), the wafer on which circuits are formed in step 14 are divided into chips. This step includes the sub-steps of assembly (dicing and bonding) and packaging (chip encapsulation). In step 16 (test), the semiconductor devices produced in the previous steps are tested to determine whether they operate correctly. The reliability of the devices are also evaluated in step 16. The semiconductor devices which have been completed in the previous steps are shipped in step 17.

Figure 9:
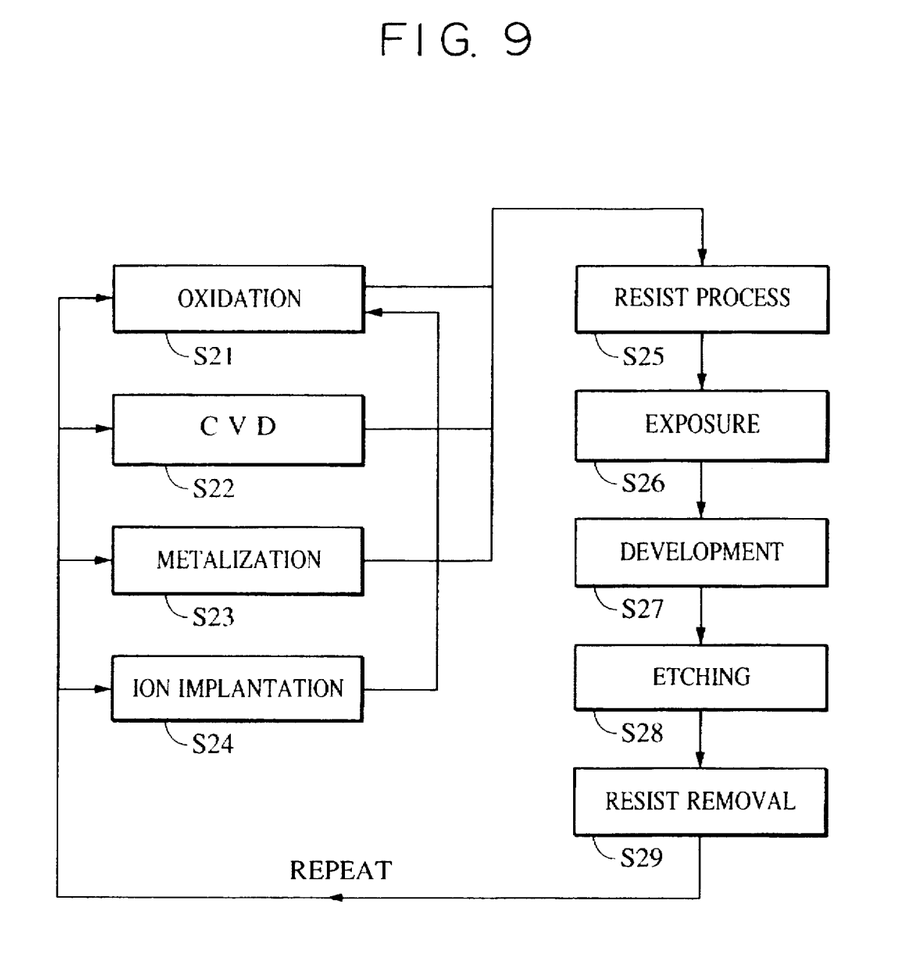
FIG. 9 is a flowchart illustrating a wafer process.

FIG. 9 is a flowchart illustrating the details of the wafer process. In step 21 (oxidation), the surface of the wafer is oxidized. In step 22 (CVD), an insulating film is formed on the surface of the wafer. In step 23 (metallization), electrodes are formed on the surface of the wafer by means of evaporation. In step 24 (ion implantation), ions are implanted into the wafer. In step 26 (resist process), a photosensitive material is coated on the wafer. In step 26 (exposure), the circuit pattern formed on the mask is transferred onto the wafer using the projection exposure apparatus described above. In step 27 (development), the above wafer is developed. In step 28 (etching), the surface of the wafer is partially removed except the portions covered by the resist pattern developed in the previous step. In step 29 (resist removal), the resist, which is no longer necessary after the etching process, is removed. The above process is performed repeatedly thereby forming a multilevel circuit pattern on the wafer. Thus, the present embodiment of the invention provides a method of producing a semiconductor device, capable of producing a semiconductor device with a high integration density, which cannot be achieved by the conventional techniques.

Except as otherwise disclosed herein, the various components shown in outline or in block form in the Figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A projection exposure apparatus comprising:

a reticle stage for moving a reticle;

a wafer stage for moving a wafer;

a projection optical system for projecting a pattern formed on the reticle onto the wafer;

first supporting means for supporting at least one of said reticle stage and said wafer stage;

measurement means for measuring the position of at least one of the reticle and the wafer;

second supporting means for supporting said measurement means; and displacement/deformation absorbing means, through which said second supporting means is supported by said first supporting means, for absorbing displacement and deformation of said first supporting means.

2. An apparatus according to claim 1, wherein said displacement/deformation absorbing means comprises at least three sliding members elastically connected to one of said first and second supporting means, wherein said at least three sliding members support spherical members which are integral parts of the other one of said first and second supporting means, said spherical members being supported such that said spherical members may freely roll.

3. An apparatus according to claim 2, wherein each of said sliding members comprises static-pressure bearing means which creates a non-contact space between said first and second supporting means.

4. An apparatus according to claim 1, wherein said displacement/deformation absorbing means comprises at least three cylindrical hinges, either end of each of said at least three cylindrical hinges being integrally connected to one of said first and second supporting means.

5. An apparatus according to claim 1, wherein said displacement/deformation absorbing means comprises a kinematic mount which connects said first and second supporting means via three spherical members formed as integral parts of one of said first and second supporting means, said spherical members being fitted into a conical recess, a V-shaped groove, and a loose fitting recess, respectively, which are all formed on the other one of said first and second supporting means.

6. An apparatus according to claim 1, wherein said projection optical system is supported by said second supporting means.

7. An exposure method comprising the steps of:

moving a reticle on a reticle stage;

moving a wafer on a wafer stage;

projecting a pattern formed on the reticle onto the wafer through a projection optical system;

supporting at least one of the reticle stage and the wafer stage on a main frame;

measuring the position of at least one of the reticle and the wafer using measurement means;

supporting the measurement means by a top frame;

providing displacement/deformation absorbing means, through which the top frame is supported by the main frame, for absorbing displacement and deformation of the main frame; and exposing the wafer to light by projecting the pattern formed on the reticle onto the wafer through the projection optical system, to transfer a pattern formed on the reticle onto the wafer.

8. An exposure method comprising the steps of:

moving a reticle on a reticle stage;

moving a wafer on a wafer stage;

projecting a pattern formed on the reticle onto the wafer through a projection optical system;

supporting at least one of the reticle stage and the wafer stage on a main frame;

measuring the position of at least one of the reticle and the wafer using measurement means;

supporting the measurement means by a top frame;

providing displacement/deformation absorbing means, through which the top frame is supported by the main frame for absorbing displacement and deformation of the main frame; and transferring, through the projection optical system, a pattern formed on the reticle onto the wafer.

* * * * *